United States Patent
Toyota

(10) Patent No.: US 10,644,671 B2
(45) Date of Patent: May 5, 2020

(54) SURFACE ACOUSTIC WAVE DEVICE

(71) Applicant: Murata Manufacturing Co., Ltd., Nagaokakyo-shi, Kyoto-fu (JP)

(72) Inventor: Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 774 days.

(21) Appl. No.: 15/285,536

(22) Filed: Oct. 5, 2016

(65) Prior Publication Data

US 2017/0026026 A1  Jan. 26, 2017

Related U.S. Application Data

(63) Continuation of application No. PCT/JP2015/060051, filed on Mar. 31, 2015.

(30) Foreign Application Priority Data

May 7, 2014  (JP) ................. 2014-095894

(51) Int. Cl.
| | | |
|---|---|---|
| *H03H 3/08* | (2006.01) | |
| *H03H 9/64* | (2006.01) | |
| *H03H 9/02* | (2006.01) | |
| *H03H 9/13* | (2006.01) | |

(52) U.S. Cl.
CPC .......... *H03H 9/02535* (2013.01); *H03H 3/08* (2013.01); *H03H 9/02992* (2013.01); *H03H 9/131* (2013.01); *H03H 9/64* (2013.01)

(58) Field of Classification Search
CPC combination set(s) only.
See application file for complete search history.

(56) References Cited

U.S. PATENT DOCUMENTS

| | | | |
|---|---|---|---|
| 9,368,712 B2* | 6/2016 | Kimura | H03H 9/14541 |
| 2004/0070313 A1 | 4/2004 | Furukawa et al. | |
| 2005/0046307 A1 | 3/2005 | Sakaguchi et al. | |
| 2010/0045145 A1 | 2/2010 | Tsuda | |
| 2010/0237750 A1 | 9/2010 | Sakashita et al. | |
| 2013/0069481 A1 | 3/2013 | Kimura et al. | |

(Continued)

FOREIGN PATENT DOCUMENTS

| | | |
|---|---|---|
| JP | 04-369912 A | 12/1992 |
| JP | 2001-085968 A | 3/2001 |

(Continued)

OTHER PUBLICATIONS

Official Communication issued in corresponding International Application PCT/JP2015/060051, dated Jun. 16, 2015.

*Primary Examiner* — Thomas M Dougherty
*Assistant Examiner* — Karen B Addison
(74) *Attorney, Agent, or Firm* — Keating & Bennett, LLP

(57) ABSTRACT

A surface acoustic wave device includes a piezoelectric substrate, an IDT electrode that is provided on the piezoelectric substrate and includes combtooth-shaped electrode fingers, and a wiring electrode that is connected to the IDT electrode. A line width of the electrode fingers at a lower edge thereof and a line width of the electrode fingers at an upper edge thereof in a cross section of the electrode fingers that is perpendicular or substantially perpendicular to a longitudinal direction of the electrode fingers is smaller than a maximum line width of the electrode fingers.

16 Claims, 7 Drawing Sheets

(56) References Cited

U.S. PATENT DOCUMENTS

2013/0207514 A1     8/2013   Sakaguchi et al.
2013/0335170 A1   12/2013   Ikuta et al.
2014/0333392 A1   11/2014   Tsuda

FOREIGN PATENT DOCUMENTS

| | | |
|---|---|---|
| JP | 2005-102158 A | 4/2005 |
| JP | 2008-079275 A | 4/2008 |
| JP | 2010-050539 A | 3/2010 |
| JP | 2010-226171 A | 10/2010 |
| JP | 2011-119900 A | 6/2011 |
| JP | 2011-124745 A | 6/2011 |
| WO | 03/058813 A1 | 7/2003 |
| WO | 2011/058930 A1 | 5/2011 |
| WO | 2011/145449 A1 | 11/2011 |
| WO | 2012/036178 A1 | 3/2012 |
| WO | 2012/102131 A1 | 8/2012 |
| WO | 2013/118532 A1 | 8/2013 |

* cited by examiner

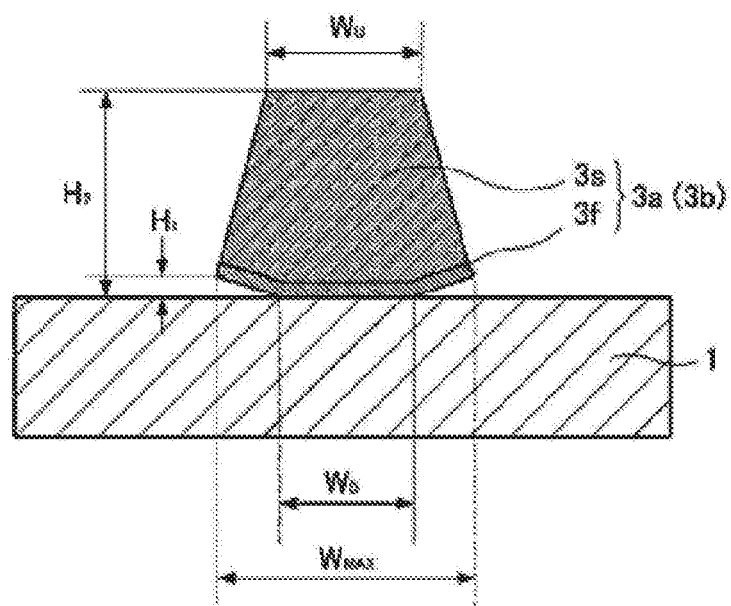

200

200

SURFACE ACOUSTIC WAVE DEVICE

CROSS REFERENCE TO RELATED APPLICATIONS

This application claims the benefit of priority to Japanese Patent Application 2014-095894 filed on May 7, 2014 and is a Continuation Application of PCT/JP2015/060051 filed on Mar. 31, 2015. The entire contents of each application are hereby incorporated herein by reference.

BACKGROUND OF THE INVENTION

1. Field of the Invention

The present invention relates to a surface acoustic wave device and, more specifically, relates to a surface acoustic wave device in which short-circuit breakages are unlikely to occur between electrode fingers of an IDT electrode of different potentials even when the pitch between the electrode fingers is small and in which reliable electrical connections are realized between the IDT electrode and a wiring electrode.

2. Description of the Related Art

Surface acoustic wave devices are widely used as filters in mobile communication devices and so forth.

In a surface acoustic wave device, a relationship v=f×λ exists, where v is the acoustic velocity of a surface acoustic wave, f is the frequency of the surface acoustic wave and λ is the wavelength of the surface acoustic wave. Therefore, in the case where the acoustic velocity of the surface acoustic wave, which is determined by various conditions such as the material of a piezoelectric substrate, is constant, there is an inversely proportional relationship between the frequency of the surface acoustic wave and the wavelength of the surface acoustic wave, in other words, the pitch of the electrode fingers of the IDT electrode.

In recent years, the frequencies used in mobile communications have been increasing, and in conjunction with this, it has been necessary to reduce the pitch of the electrode fingers of IDT electrodes. However, when the pitch of the electrode fingers of IDT electrodes is reduced, the insulation resistance between electrode fingers of different potentials becomes smaller and therefore there is a risk of insulation breakages occurring due to short circuits between the electrode fingers of different potentials when a surge voltage is applied to the surface acoustic wave device.

Generally, insulation breakages between electrode fingers of an IDT electrode of different potentials are more likely to occur along a path that extends through a piezoelectric substrate than along a path that extends through air. This is because the insulation resistance of a piezoelectric substrate is smaller than that of air.

Accordingly, in a surface acoustic wave device disclosed in Japanese Unexamined Patent Application Publication No. 2001-85968, for example, a method is employed in which a small line width ($W_S$) is adopted as the width of the electrode fingers of an IDT electrode in parts of the electrode fingers that contact the piezoelectric substrate and a large line width ($W_B$) is adopted as the width of the electrode fingers in other parts of electrode fingers in order to ensure that insulation breakages due to short circuits do not occur between electrode fingers of different potentials because of a surge voltage or the like even when the pitch of the electrode fingers of the IDT electrode has been made small.

FIG. 8 illustrates a cross section taken along X-X in FIG. 7 for the case where the method of preventing insulation breakages between electrode fingers of different potentials disclosed in Japanese Unexamined Patent Application Publication No. 2001-85968 is applied to a surface acoustic wave device 200 (refer to FIG. 7) disclosed in Japanese Unexamined Patent Application Publication No. 2005-102158.

Electrode fingers 103a and 103b of IDT electrodes 102 are each formed of two layers, namely, an electrode finger lower layer 103f that contacts a piezoelectric substrate 101 and an electrode finger upper layer 103s that is provided on the electrode finger lower layer 103f. The electrode finger lower layer 103f is formed to have a small line width $W_S$ and the electrode finger upper layer 103s is formed to have a large line width $W_B$. This type of structure made up of the electrode finger lower layer 103f and the electrode finger upper layer 103s can be easily formed by using a dry etching method.

With the method disclosed in Japanese Unexamined Patent Application Publication No. 2001-85968, a large insulation resistance can be maintained between the electrode fingers 103a and 103b of different potentials even when a pitch P of the electrode fingers of the IDT electrodes has been made small in order to handle high frequencies.

In other words, when the pitch P is made small, an interval Ds between the electrode finger upper layers 103s of the electrode fingers 103a and 103b of different potentials becomes smaller. However, since air, which has a large insulation resistance, exists in the interval Ds, insulation breakages due to short circuits are unlikely to occur in these parts even when a surge voltage is applied.

On the other hand, an interval Df between the electrode finger lower layers 103f of different potentials can be left at the same size even when the pitch P is made smaller. Although this part of the electrode fingers contacts the piezoelectric substrate 101, which has a small insulation resistance compared to air, since the interval Df does not become smaller, insulation breakages due to a short circuit occurring via the piezoelectric substrate 101 are unlikely to happen even when a surge voltage is applied.

Thus, by employing the method disclosed in Japanese Unexamined Patent Application Publication No. 2001-85968, a large insulation resistance can be maintained between the electrode fingers 103a and 103b of different potentials even when the pitch P of the electrode fingers of the IDT electrode has been made small in order to handle high frequencies.

However, when the above-described method is employed, there is a problem in that an electrical connection between the IDT electrode and a wiring electrode may be inadequate. This will be described below.

A wiring electrode may be provided in a surface acoustic wave device as disclosed in Japanese Unexamined Patent Application Publication No. 2005-102158. A surface acoustic wave device 200 of the related art is illustrated in FIG. 7.

IDT electrodes 102 are formed on a piezoelectric substrate 101. Each IDT electrode 102 includes a set consisting of comb-tooth-shaped electrode fingers 103a and 103b, which have different potentials, and busbars 104. A wiring electrode 105 is connected to each busbar 104. A state is illustrated in FIG. 9 in which the electrical connection between the IDT electrode 102 (busbar 104) and the wiring electrode 105 is inadequate in the case where the method disclosed in Japanese Unexamined Patent Application Publication No. 2001-85968 has been applied to the surface acoustic wave device 200 disclosed in Japanese Unexamined Patent Application Publication No. 2005-102158 illustrated in FIG. 7. FIG. 9 illustrates a cross section taken along Y-Y in FIG. 7.

When the electrode fingers 103a and 103b of the IDT electrode 102 are formed such that the line width $W_S$ of the electrode finger lower layer 103f is small and the line width $W_B$ of the electrode finger upper layer 103s is large (refer to FIG. 8), as illustrated in FIG. 9, the busbar 104 also has a two layer structure made up of a busbar lower layer 104f and a busbar upper layer 104s, and the busbar lower layer 104f is structured so as to be recessed from the busbar upper layer 104s at an outer peripheral edge of the busbar 104.

Typically, the wiring electrode 105 is often formed using a liftoff method. In other words, the wiring electrode 105 is often formed by arranging a resist having a desired pattern shape and then depositing (vapor depositing) a metal film. However, in the case where the wiring electrode 105 is formed using a liftoff method, when the busbar lower layer 104f is formed so as to be recessed from the busbar upper layer 104s at the outer peripheral edge of the busbar 104, the electrical connection between the busbar 104 and the wiring electrode 105 may be inadequate.

That is, when the wiring electrode 105 is formed using a liftoff method, the portion of the wiring electrode 105 on the piezoelectric substrate 101 is deposited in such a manner as to remain unconnected to the busbar lower layer 104f at the outer peripheral edge of the busbar 104 at the very start of the deposition process. This is because the deposition is started in a state where the busbar lower layer 104f is formed so as to be recessed and the busbar upper layer 104s acts as an overhanging portion.

As the deposition progresses, the wiring electrode 105 is also deposited on the busbar 104, but an end surface of the portion of the wiring electrode 105 on the busbar 104 also grows in a horizontal direction, forms an overhanging portion and covers an end surface of the portion of the wiring electrode 105 on the piezoelectric substrate 101. As a result, the end surface of the portion of the wiring electrode 105 on the piezoelectric substrate 101 is formed with a tapered shape that is inclined in a direction away from the busbar 104 as the deposition progresses.

The deposition is completed with the portion of the wiring electrode 105 on the piezoelectric substrate 101 remaining unconnected to the busbar 104 and remaining unconnected to the portion of the wiring electrode 105 deposited on the busbar 104. In other words, a gap G is formed between the portion of the wiring electrode 105 on the piezoelectric substrate 101, the busbar 104 and the portion of the wiring electrode 105 on the busbar 104.

Consequently, the electrical connection between the IDT electrode 102 (busbar 104) and the wiring electrode 105 may be inadequate. For example, the IDT electrode 102 and the wiring electrode 105 may be completely disconnected from each other. In addition, even if the IDT electrode 102 and the wiring electrode 105 are not completely disconnected from each other, the gap G may be partially formed between the IDT electrode 102 and the wiring electrode 105, thereby increasing the wiring resistance.

SUMMARY OF THE INVENTION

In view of the above-described problems of the related art, a preferred embodiment of the present invention provides a surface acoustic wave device including a piezoelectric substrate; an IDT electrode that is provided on the piezoelectric substrate and includes combtooth-shaped electrode fingers; and a wiring electrode that is connected to the IDT electrode; wherein a line width at a lower edge and a line width at an upper edge of each of the electrode fingers in a cross section of the electrode finger that is perpendicular or substantially perpendicular to a longitudinal direction of the electrode finger are smaller than a maximum line width of the electrode finger. With this structure, short-circuit breakages are unlikely to occur between electrode fingers of the IDT electrode of different potentials even when the pitch of the electrode fingers has been made small and a reliable electrical connection is realized between the IDT electrode and the wiring electrode.

It is preferable that the cross section of each of the electrode fingers have a shape including tapered edges that extend from the upper edge to a portion of the electrode finger having the maximum line width. In this case, a more reliable electrical connection is realized between the IDT electrode and the wiring electrode.

It is preferable that a height of a portion of the electrode fingers from the piezoelectric substrate to the portion of the electrode fingers having the maximum line width be about ⅓ or less a height of the electrode fingers. In this case, a more reliable electrical connection is realized between the IDT electrode and the wiring electrode.

The IDT electrode may include a plurality of layers including at least a joining layer that contacts the piezoelectric substrate and a main electrode layer that is provided on the joining layer.

It is preferable that the main electrode layer be formed of Al, an alloy containing Al, Cu, or an alloy containing Cu. In this case, a surface acoustic wave device is able to achieve a smaller loss.

It is preferable that the joining layer be formed of Ti, Cr, Ni or NiCr. In this case, the strength of the joint, bond or connection between the piezoelectric substrate and the IDT electrode is improved.

The IDT electrode may be formed using a liftoff method, for example.

According to various preferred embodiments of the present invention of the present application, surface acoustic wave devices are obtained in which short-circuit breakages are unlikely to occur between electrode fingers of an IDT electrode of different potentials even when the pitch of the electrode fingers has been made small and in which a reliable electrical connection is realized between the IDT electrode and the wiring electrode.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a sectional view illustrating electrode fingers 3a and 3b of the surface acoustic wave device 100.

DETAILED DESCRIPTION OF THE PREFERRED EMBODIMENTS

Hereafter, preferred embodiments of the present invention will be described along with the drawings.

Figure 1:
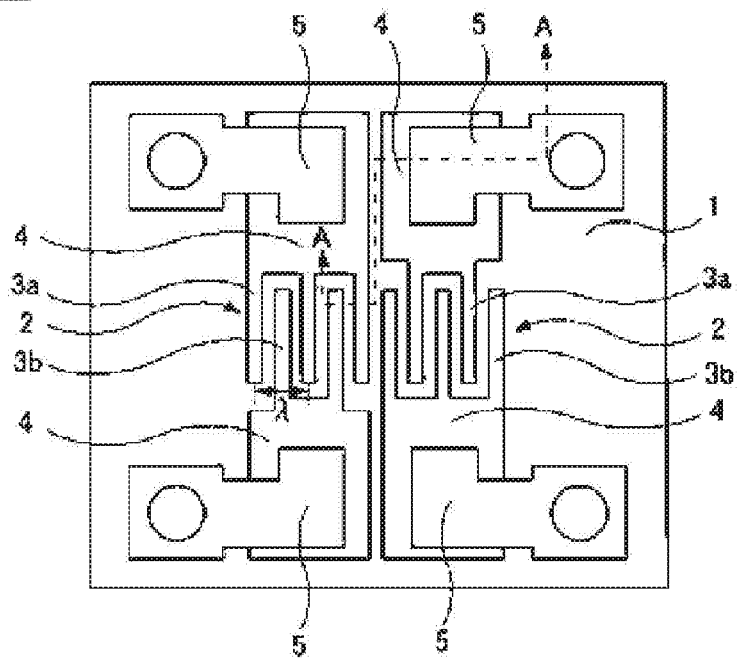
FIG. 1 is a plan view illustrating a surface acoustic wave device 100 according to a preferred embodiment of the present invention.
Figure 2:
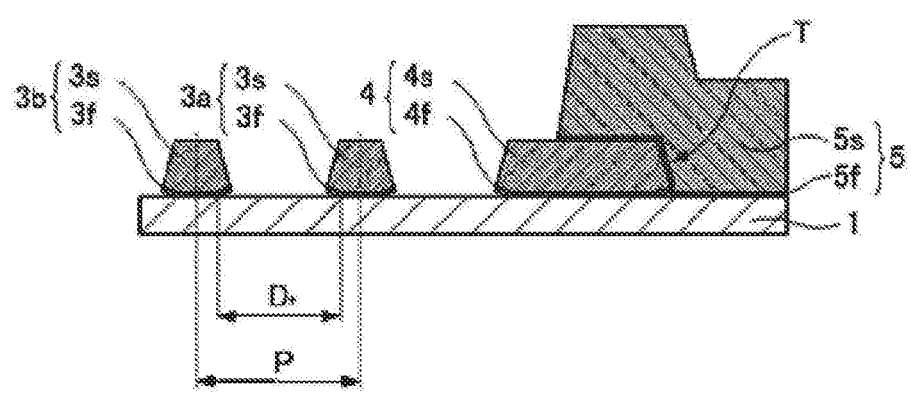
FIG. 2 is a sectional view of the surface acoustic wave device 100 illustrating a portion extending along a single dot chain line A-A in FIG. 1.

FIGS. 1 to 3 illustrate a surface acoustic wave device 100 according to a preferred embodiment of the present invention. FIG. 1 is a plan view, FIG. 2 is a sectional view illustrating a portion extending along a single dot chain line A-A in FIG. 1 and FIG. 3 is a sectional view of electrode fingers of an IDT electrode.

The surface acoustic wave device 100 includes a piezoelectric substrate 1. The piezoelectric substrate 1 preferably is composed of 42° Y-cut LiTaO$_3$, for example. However, the material and the cut angle of the piezoelectric substrate 1 are not limited to these examples and another material such as LiNbO$_3$ or Li$_2$B$_4$O$_7$ may be used for example and the cut angle may also be appropriately chosen.

IDT electrodes 2 are provided on the piezoelectric substrate 1. Each IDT electrode 2 includes comb-tooth-shaped electrode fingers 3a and 3b, which have different potentials, and busbars 4. "λ" in FIG. 1 represents the wavelength of a surface acoustic wave.

As is clear from FIG. 2, in each IDT electrode 2, the electrode fingers 3a and 3b and the busbars 4 each preferably include two layers. However, the numbers of layers of the electrode fingers 3a and 3b and the busbars 4 are not limited to two, and may instead be one or three or more.

In other words, the electrode fingers 3a and 3b of the IDT electrodes 2 each preferably include two layers, namely, an electrode finger lower layer 3f that contacts the piezoelectric substrate 1 and an electrode finger upper layer 3s that is provided on the electrode finger lower layer 3f. The busbars 4 of the IDT electrodes 2 also each preferably include two layers, namely, a busbar lower layer 4f that contacts the piezoelectric substrate 1 and a busbar upper layer 4s that is provided on the busbar lower layer 4f.

The electrode finger lower layer 3f and the busbar lower layer 4f define and function as joining layers that improve the strength of the connections to the piezoelectric substrate 1. The electrode finger lower layer 3f and the busbar lower layer 4f are preferably composed of Ti, for example. However the material is not limited to this and may be Cr, Ni or NiCr, for example.

The electrode finger upper layer 3s and the busbar upper layer 4s define and function as main electrode layers. The electrode finger upper layer 3s and the busbar upper layer 4s are composed of AlCu, for example. However, the material is not limited to this and may be Al or another alloy containing Al or may be Cu or another alloy containing Cu.

As illustrated in FIG. 3, the electrode fingers 3a and 3b of the IDT electrode 2 each have a line width $W_D$ at a lower edge thereof that contacts the piezoelectric substrate 1 and a line width $W_U$ at an upper edge thereof when looking at a cross section that is perpendicular or substantially perpendicular to a longitudinal direction of the electrode fingers 3a and 3b. The line width $W_D$ at the lower edge and the line width $W_U$ at the upper edge are smaller than a maximum line width $W_{MAX}$ of the electrode fingers 3a and 3b.

Consequently, in the surface acoustic wave device 100, as illustrated in FIG. 2, the size of the interval Df between the portions of the electrode fingers 3a and 3b that contact the piezoelectric substrate 1 is able to be maintained constant even when a pitch P of the electrode fingers 3a and 3b of different potentials has been made small. Although the insulation resistance of the piezoelectric substrate 1 is small compared with that of air, since the size of the interval Df is able to be maintained constant in the surface acoustic wave device 100 even when the pitch P has been made small, an insulation breakage caused by a short circuit occurring via the piezoelectric substrate 1 is unlikely to occur even when a surge voltage is applied. Therefore, a short-circuit breakage is unlikely to occur between the electrode fingers 3a and 3b of different potentials in the surface acoustic wave device 100 even though the pitch P between the electrode fingers 3a and 3b of different potentials has been made small in order to handle high frequencies, for example.

The wiring electrodes 5 are connected to the busbars 4 of the surface acoustic wave device 100. As is clear from FIG. 2, in this preferred embodiment, the wiring electrodes 5 also reach preferably include two layers, namely, a wiring electrode lower layer 5f and a wiring electrode upper layer 5s that is provided on the wiring electrode lower layer 5f. However, the number of layers of the wiring electrodes 5 may be appropriately chosen and the wiring electrodes may instead include only one layer or three or more layers. In this preferred embodiment, the wiring electrode lower layer 5f preferably is composed of Ti, for example. However the material is not limited to this and may be Cr, Ni or NiCr, for example. In addition, the wiring electrode upper layer 5s is preferably composed of Al, for example. However, the material is not limited to this and may be an alloy containing Al, may be Cu or may be an alloy containing Cu.

Reliable electrical connections are realized between the busbars 4 and the wiring electrodes 5 in the surface acoustic wave device 100. As illustrated in FIG. 2, this is because a taper T is provided at the end surface of the busbar 4 where the wiring electrode 5 is connected to the busbar 4. In other words, this is because, when the taper T is provided at the end surface of the busbar 4, a metal film is deposited on the taper T and this metal film functions so as to connect a metal film deposited on the piezoelectric substrate 1 and a metal film deposited on the busbar 4 when the wiring electrode 5 is formed using a liftoff method, for example. In the surface acoustic wave device 100, the wiring electrodes 5 are each formed continuously, without breaks, from the region above the piezoelectric substrate 1 to the region above the busbar 4.

When the IDT electrodes 2 are formed using a liftoff method or the like, the line width $W_D$ of the electrode fingers 3a and 3b at the lower edges thereof and the line width $W_U$ of the electrode fingers 3a and 3b at the upper edges thereof are made to be smaller than the maximum line width $W_{MAX}$ of the electrode fingers 3a and 3b, and the tapers T of the busbars 4 are formed in a corresponding manner. In other words, tapered edges are formed to extend from the upper edges of the electrode fingers 3a and 3b to the portions of the electrode fingers 3a and 3b having the maximum line width by making the line width $W_U$ of the electrode fingers 3a and 3b at the upper edges thereof be smaller than the portions of the electrode fingers 3a and 3b having the maximum line width $W_{MAX}$, and in the case where the IDT electrodes 2 are formed using a liftoff method or the like, the tapers T are simultaneously formed at the end surfaces of the busbars 4 where the wiring electrodes 5 are connected.

A height $H_1$ of the portions of the electrode fingers 3a and 3b having the maximum line width $W_{MAX}$ is preferably about ⅓ or less a height $H_2$ of the electrode fingers 3a and 3b up to the upper edges of the electrode fingers 3a and 3b. If the height H1 exceeds about ⅓, the distance between the taper T of the busbar 4 and the piezoelectric substrate 1 becomes too large and the reliability of the electrical connection between the busbar 4 and the wiring electrode 5 may be degraded.

Hereafter, a non-limiting example of a method of manufacturing the surface acoustic wave device 100 according to this preferred embodiment will be described while referring to FIGS. 4A-6J, which are sectional views illustrating steps of the manufacturing method and illustrate a portion extending along the single dot chain line A-A in FIG. 1.

Figure 4A:
FIGS. 4A-4D are sectional views illustrating steps used in an example of a method of manufacturing the surface acoustic wave device 100, where each of FIGS. 4A-4D corresponds to the portions extending along the single dot chain line A-A in FIG. 1.

First, as illustrated in FIG. 4A, the piezoelectric substrate 1 is prepared.

Figure 4B:
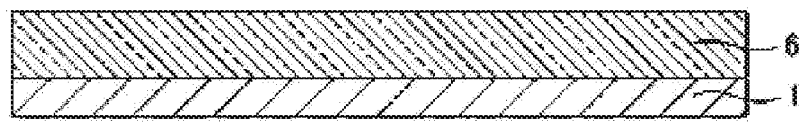

Next, as illustrated in FIG. 4B, a positive resist 6 is applied onto the piezoelectric substrate 1. After that, the positive resist 6 is subjected to a chlorobenzene treatment.

Figure 4C:
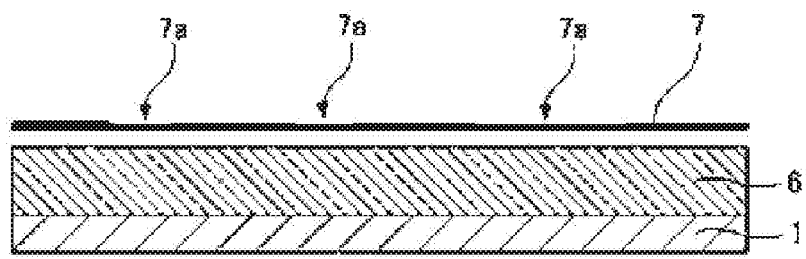

Next, as illustrated in FIG. 4C, a photomask 7 having a desired opening pattern 7a is arranged on the positive resist 6.

Figure 4D:
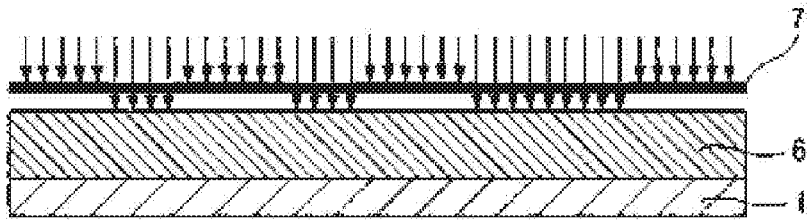

Next, as illustrated in FIG. 4D, the positive resist 6 is exposed to light via the photomask 7. At this time, an under exposure condition is adopted in which the amount of exposure is less than the proper exposure amount.

Figure 5E:
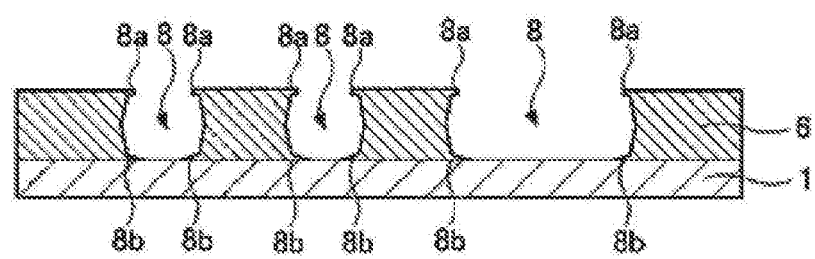
FIGS. 5E-5G sectional views and illustrate steps continuing on from FIGS. 4A-4D, where each of FIGS. 5E-5G corresponds to the portion extending along the single dot chain line A-A in FIG. 1.

Next, as illustrated in FIG. 5E, the positive resist 6 is developed. As a result, openings 8 having desired shapes are formed in the positive resist 6. Overhanging portions 8a are formed at the tops of the openings 8. The overhanging portions 8a are formed as a result of the surface of the positive resist becoming softer when the positive resist 6 applied onto the piezoelectric substrate 1 is subjected to the chlorobenzene treatment. Base portions 8b are formed at the bottoms of the openings 8. The base portions 8b are formed as a result of the underexposure condition being used in which the amount of exposure is less than the proper exposure amount when the positive resist 6 is exposed to light.

Figure 5F:
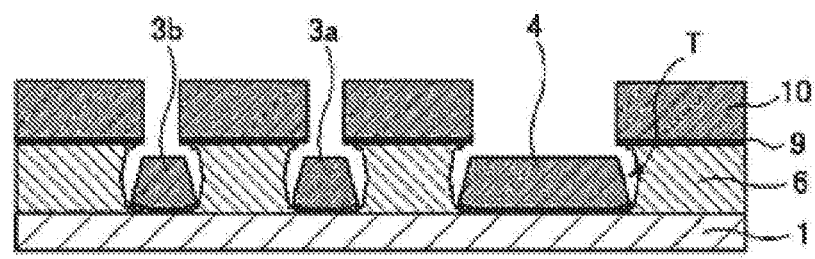

Next, as illustrated in FIG. 5F, a Ti layer 9 having a thickness of about 10 nm and an AlCu layer 10 having a thickness of about 150 nm, for example, are sequentially formed on the piezoelectric substrate 1 through the positive resist 6 by using vacuum deposition. As a result, the electrode fingers 3a and 3b and the busbars 4 of the IDT electrodes 2 are formed inside the openings 8 of the positive resist 6. At this time, since the overhanging portions 8a have been formed at the tops of the openings 8 and the base portions 8b have been formed at the bottoms of the openings 8, the cross sections of the electrode fingers 3a and 3b come to have a shape in which the line width $W_D$ at the lower edges and the line width $W_U$ at the upper edges of the electrode fingers 3a and 3b are both smaller than the maximum line width $W_{MAX}$ of the electrode fingers 3a and 3b, as illustrated in FIG. 3. In addition, since the overhanging portions 8a have been formed at the tops of the openings 8, the tapers T are formed at the end surfaces of the busbars 4 where the wiring electrodes 5 are connected.

Figure 5G:
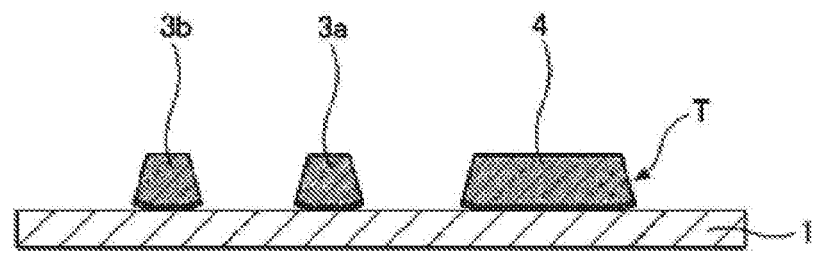

Next, as illustrated in FIG. 5G, the positive resist 6 is removed. As a result, the electrode fingers 3a and 3b and the busbars 4 of the IDT electrodes 2 are left on the surface of the piezoelectric substrate 1.

Figure 6H:
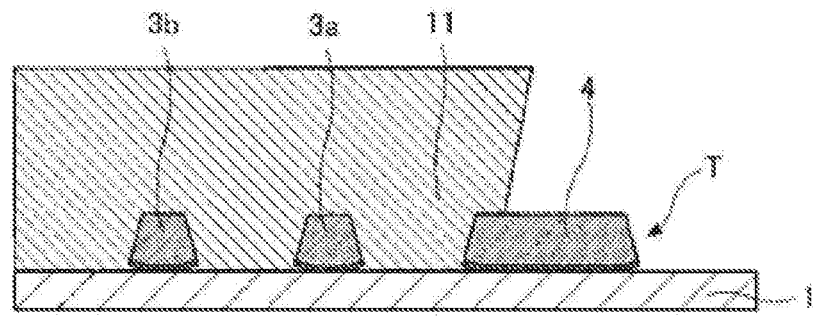
FIGS. 6H-6J are sectional views and illustrate steps continuing on from FIGS. 5E-5G, where each of FIGS. 6H-6J corresponds to the portion extending along the single dot chain line A-A in FIG. 1.

Next, a negative resist is applied onto the piezoelectric substrate 1. After that, the negative resist is exposed to light through a photomask having a desired opening pattern and is developed, whereby, as illustrated in FIG. 6H, a negative resist 11 having a desired pattern is formed. The negative resist 11 is a negative type of resist and therefore the end surfaces thereof have a reverse taper shape.

Figure 6I:
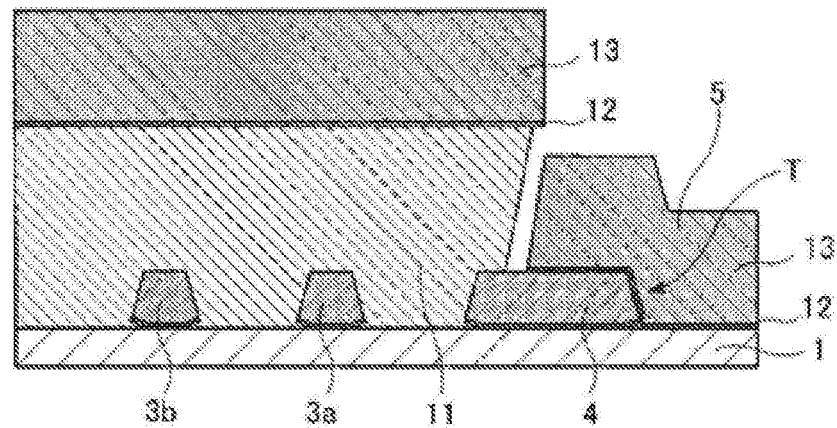

Next, as illustrated in FIG. 6I, a Ti layer 12 having a thickness of about 100 nm and an Al layer 13 having a thickness of about 1000 nm are sequentially formed on the piezoelectric substrate 1 via the negative resist 11 by using vacuum deposition. As a result, the wiring electrodes 5, which are connected to the busbars 4 of the IDT electrodes 2, are formed. Since the tapers T are formed at the end surfaces of the busbars 4, reliable electrical connections are realized between the busbars 4 and the wiring electrodes 5.

Figure 6J:
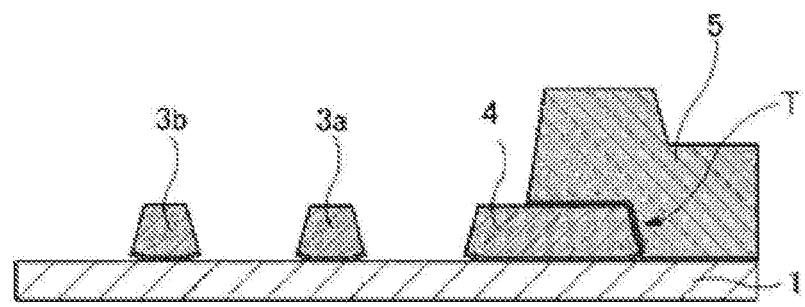
Figure 7:
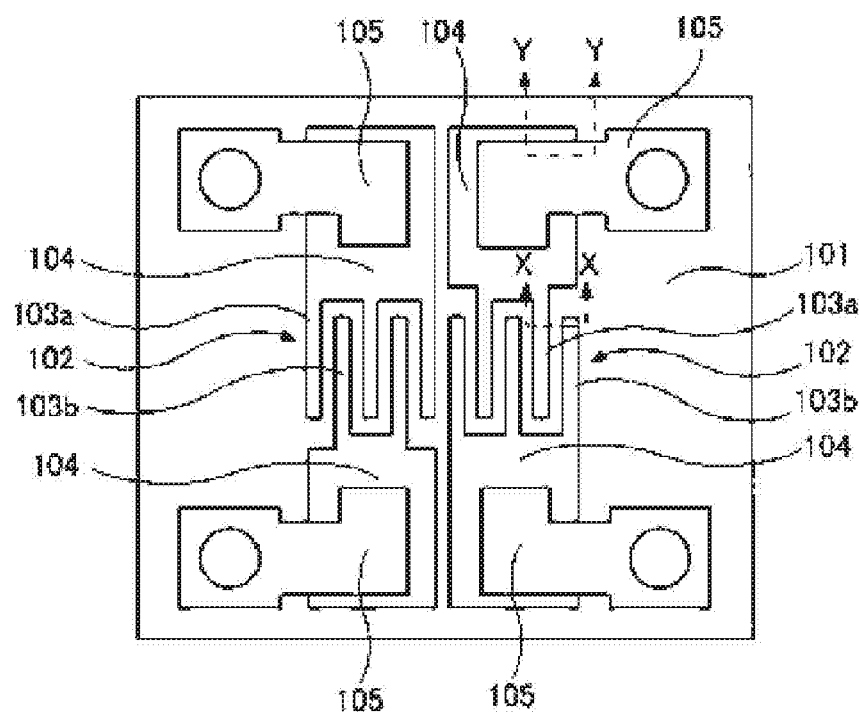
FIG. 7 is a plan view illustrating a surface acoustic wave device 200 of the related art disclosed in Japanese Unexamined Patent Application Publication No. 2005-102158.
Figure 8:
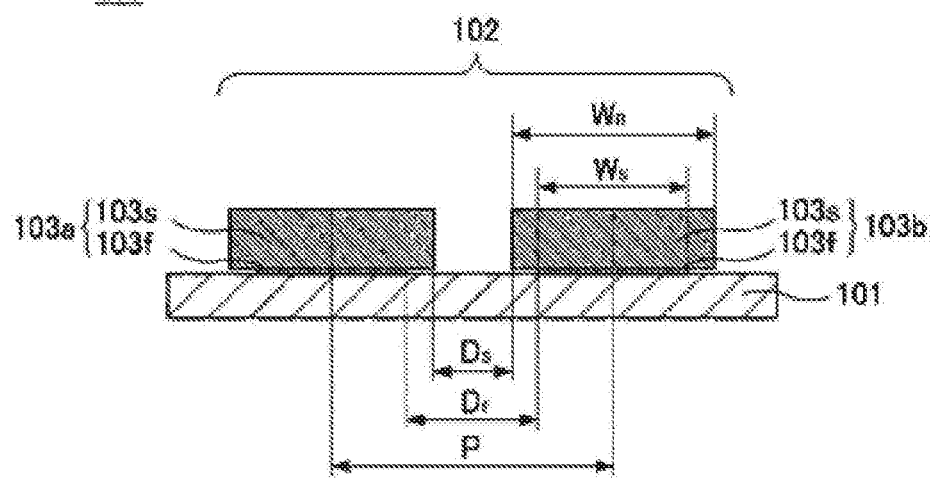
FIG. 8 is a sectional view illustrating a case in which a method of preventing an insulation breakage between electrode fingers of different potentials disclosed in Japanese Unexamined Patent Application Publication No. 2001-85968 is applied to the surface acoustic wave device 200, and illustrates a part extending along a single dot chain line X-X in FIG. 7.
Figure 9:
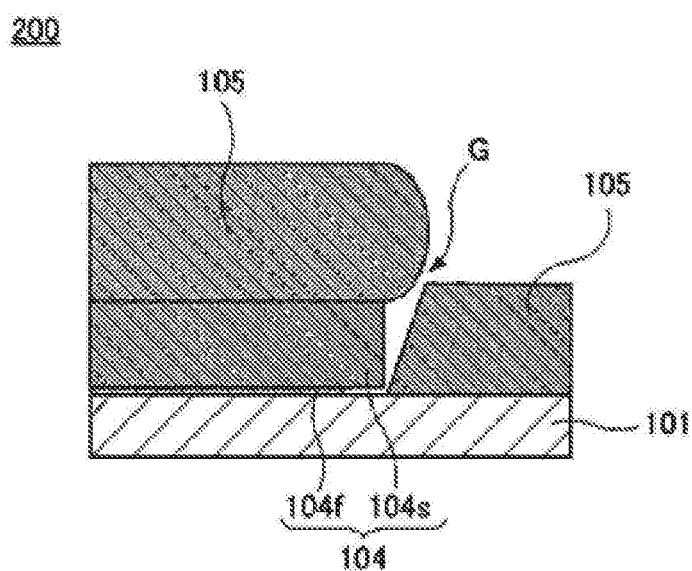
FIG. 9 is a sectional view illustrating a case in which an electrical connection between an IDT electrode 102 (busbar 104) and a wiring electrode 105 is inadequate when the method of preventing an insulation breakage between electrode fingers of different potentials disclosed in Japanese Unexamined Patent Application Publication No. 2005-102158 is applied to the surface acoustic wave device 200, and illustrates a part extending along a single dot chain line Y-Y in FIG. 7.

Finally, as illustrated in FIG. 6J, manufacturing of the surface acoustic wave device 100 according to this preferred embodiment is completed by removing the negative resist 11.

Since the surface acoustic wave device 100 is manufactured using a liftoff method in the above-described manufacturing method, the freedom with which the respective materials can be selected is improved compared with a case where a surface acoustic wave device is manufactured using a dry etching method or the like.

Examples of the structure of the surface acoustic wave device 100 according to preferred embodiments and a manufacturing method therefor have been described above. However, the invention of the present application is not limited to the above-described content and various design changes can be made thereto whilst not departing from the gist thereof.

For example, although one pair of IDT electrodes 2 is provided on the piezoelectric substrate 1 in the surface acoustic wave device 100, the circuit arrangement of the surface acoustic wave device may be appropriately chosen and the number of IDT electrodes 2 is not limited to one pair.

Furthermore, although the IDT electrodes 2 and the wiring electrodes 5 of the surface acoustic wave device 100 each preferably include two layers, the numbers of layers of the IDT electrodes 2 and the wiring electrodes 5 are not limited to two. The IDT electrodes 2 and the wiring electrodes 5 may have different numbers of layers. In addition, the materials of the IDT electrodes 2 and the wiring electrodes 5 may be appropriately chosen and are not limited to those described above.

Furthermore, although the electrical connections between the IDT electrodes and the wiring electrodes 5 are realized in the busbars 4 of the IDT electrodes 2 in the surface acoustic wave device 100, the surface acoustic wave device 100 is not limited to this configuration and a configuration may instead be adopted in which connection electrodes that are electrically connected to the IDT electrodes 2 are formed and these connection electrodes and the wiring electrodes 5 are electrically connected to each other, for example.

Preferred embodiments and modifications of the present invention have been described above, but the presently disclosed embodiments and modifications are merely illustrative in all points should not be interpreted as being limiting. The scope of the present invention is to be defined by the scope of the claims and equivalents to the scope of the claims and all changes within the scope of the claims are to be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substrate;
   an IDT electrode that is provided on the piezoelectric substrate and includes combtooth-shaped electrode fingers and a busbar; and
   a wiring electrode that is connected to the busbar; wherein
   at least a portion of the wiring electrode is provided on the busbar;
   a line width at a lower edge and a line width at an upper edge in a cross section of each of the electrode fingers that is perpendicular or substantially perpendicular to a longitudinal direction of each of the electrode fingers, are smaller than a maximum line width of the electrode finger; and
   a line width at a lower edge and a line width at an upper edge in a cross section of the busbar that is perpendicular or substantially perpendicular to a longitudinal direction of each of the electrode fingers, are smaller than a maximum line width of the busbar.

2. The surface acoustic wave device according to claim 1, wherein a taper is provided at an end surface of the busbar where the wiring electrode is connected.

3. The surface acoustic wave device according to claim 1, wherein a height of a portion of at least one of the electrode fingers and the busbar from the piezoelectric substrate to the portion of the electrode fingers having the maximum line width is about ⅓ or less a height of the electrode fingers.

4. The surface acoustic wave device according to claim 1, wherein at least one of the IDT electrode and the busbar includes a plurality of layers including at least a joining layer that contacts the piezoelectric substrate and a main electrode layer that is provided on the joining layer.

5. The surface acoustic wave device according to claim 4, wherein at least one of the main electrode layer and the busbar is formed of Al, an alloy containing Al, Cu, or an alloy containing Cu.

6. The surface acoustic wave device according to claim 4, wherein the joining layer is formed of Ti, Cr, Ni or NiCr.

7. The surface acoustic wave device according to claim 1, wherein at least one of the IDT electrode and the busbar is made of a material that is formed using a liftoff method.

8. The surface acoustic wave device according to claim 1, wherein the piezoelectric substrate is made of one of 42° Y-cut $LiTaO_3$, $LiNbO_3$ and $Li_2B_4O_7$.

9. The surface acoustic wave device according to claim 1, wherein at least one of each of the electrode fingers and the busbar includes only one layer.

10. The surface acoustic wave device according to claim 1, wherein at least one of each of the electrode fingers and the busbar includes at least three layers.

11. The surface acoustic wave device according to claim 1, wherein a size of an interval between portions of the electrode fingers that contact the piezoelectric substrate is constant.

12. The surface acoustic wave device according to claim 1, wherein the wiring electrode includes at least two layers.

13. The surface acoustic wave device according to claim 1, wherein the wiring electrode includes only one layer.

14. The surface acoustic wave device according to claim 1, wherein the wiring electrode includes at least three layers.

15. The surface acoustic wave device according to claim 1, wherein the IDT electrode includes a pair of IDT electrodes.

16. The surface acoustic wave device according to claim 1, wherein the IDT electrode and the wiring electrode include a different number of layers.

* * * * *